US005747622A

United States Patent [19]

Maeda et al.

[11] Patent Number: 5,747,622
[45] Date of Patent: May 5, 1998

[54] POLYMER HAVING SILICON ATOMS AND SULFONIUM SALT UNITS AND PHOTORESIST COMPOSITIONS CONTAINING THE SAME

[75] Inventors: Katsumi Maeda; Shigeyuki Iwasa; Kaichiro Nakano; Etsuo Hasegawa, all of Tokyo, Japan

[73] Assignee: NEC Corporation, Tokyo, Japan

[21] Appl. No.: 797,939

[22] Filed: Feb. 12, 1997

Related U.S. Application Data

[63] Continuation of Ser. No. 223,767, Apr. 6, 1994, abandoned.

[30] Foreign Application Priority Data

| Apr. 6, 1993 | [JP] | Japan | 5-078403 |
| Aug. 18, 1993 | [JP] | Japan | 5-204357 |
| Dec. 27, 1993 | [JP] | Japan | 5-329366 |

[51] Int. Cl.⁶ ..................... C08G 77/06
[52] U.S. Cl. ..................... 528/12; 528/25; 528/29
[58] Field of Search ................... 528/12, 25, 29

[56] References Cited

U.S. PATENT DOCUMENTS

| 4,264,703 | 4/1981 | Crivello | 430/270 |
| 4,374,066 | 2/1983 | Crivello et al. | 260/440 |
| 5,466,845 | 11/1995 | Herzig | 556/12 |

FOREIGN PATENT DOCUMENTS 4219376  12/1993  Germany.
6118651  4/1994  Japan.

OTHER PUBLICATIONS

Tanaka et al. J. Photopolymer Sci. and Techn. vol. 6(1), 1993, 39–48.
Crivello et al., "A New Preparation of Triarylsulfonium and –selenonium Salts via the Copper (II)... and Selenides with Diaryliodonium Salts", *J. Org. Chem.*, vol. 43, No. 15, 1978, pp. 3055–3058.
C. W. Wilkins, Jr., et al., "An organosilicon novalac resin for multilevel resist applications", *J. Vac. Sci. Technol. B*, vol. 3, No. 1, Jan./Feb. 1985, pp. 306–309.
He et al., "Wavelength Dependence of the Photolysis of Some Anthracene–Containing Sulfonium Salts", *J. Org. Chem.*, vol. 57, 1992, pp. 759–761.
G. L. Gaines, Jr., "Solvatochromic Compound as an Acid Indicator in Nonaqueous Media", *Analytical Chemistry*, vol. 48, No. 2, Feb. 1976, pp. 450–451.

*Primary Examiner*—Helen Lee
*Attorney, Agent, or Firm*—Sughrue, Mion, Zinn, Macpeak & Seas, PLLC

[57] ABSTRACT

A polymer having silicon atoms and sulfonium salt units in its main chain is provided which is obtained from a reaction between a polymer having silicon atoms, which is obtained by polymerizing 4,4'-thiodiphenol or a mixture of 4,4'-thiodiphenol and a diol compound and a silane or siloxane derivative, and a diaryliodonium salt or an alkyl halide. The polymer having both silicon atoms and sulfonium salt units in its main chain are useful as a photoacid generator for chemically amplified resist and a base resin and a dissolution inhibitor for the resist.

23 Claims, No Drawings

POLYMER HAVING SILICON ATOMS AND SULFONIUM SALT UNITS AND PHOTORESIST COMPOSITIONS CONTAINING THE SAME

This is a Continuation of Application No. 08/223,767 filed Apr. 6, 1994, now abandoned.

BACKGROUND OF THE INVENTION

1. Field of the Invention

The present invention relates to novel polymers having silicon atoms and sulfonium salt units in their main chain and photoresist compositions containing the same, and in more particular to novel polymers having silicon atoms and sulfonium salt units useful as a cationic photoinitiator and in the field of photolithography and photoresist compositions containing the same.

2. Disclosure of the Related Art

Recently, in the field of semiconductor devices and various electronic devices in which fine processing are required, photosensitive resins have been extensively used. Particularly, in association with an advance in high integration of devices, fine patterning has been required. To attain this object, resist materials which are highly sensitive to deep ultraviolet light (deep UV light) from an excimer laser or the like has been required because the fine patterning (e.g. processing size: 0.25 μm or less) can be effectively performed by applying light having shorter exposure wavelengths which is generated, for instance, from the excimer laser such as KrF excimer laser(248 nm), ArF excimer laser(193 nm) or the like. In chemically amplified resists containing photoacid generators, photochemically generated protonic acids are applied effectively to a secondary chain transfer reaction by a post-exposure baking treatment, whereby one light absorption can be amplified chemically thousand times. As for the photoacid generator for use in the chemically amplified resist, there were known low-molecular triphenylsulfonium salts described in Crivello et al., Journal of the Organic Chemistry, Vol.43, No.15, 3055–3058, 1978, the disclosure of which is hereby incorporated by reference herein.

In addition, with reduction in size of semiconductor devices, a method of transferring resist patterns onto a substrate with high accuracy has been required. To attain this object, dry etching using gas plasma or the like has been used in place of conventional wet etching. A silylation method or multilayer resist method of performing patterning by oxygen reactive ion etching has attracted special interest recently and thus resist materials having resistance to oxygen plasma has been studied actively. The resist material having silicon atoms has excellent resistance to oxygen plasma and various silicon-containing resists have been developed. As for the silicon-containing resists, there have been known, for instance, resists (silicon-containing Novolak resin+quinone diazide) described in Wilkins et al., Journal of Vacuum Science and Technology, B3, 306–309, 1985, the disclosure of which is hereby incorporated by reference herein.

Crivello et al.'s photoacid generators as mentioned above form acids under the action of radiation such as UV rays or electron beam but have no functional groups being capable of changing the solubility thereof and have no silicon, showing almost no resistance to oxygen reactive ion etching. On the other hand, Wilkins et al.'s silicon-containing resists are not chemically-amplified type and then have insufficient sensitivity to deep UV:light and insufficient resistance to dry etching because of low silicon content. In the art, therefore, development of photosensitive polymers, which have good efficiency of photoreaction, exhibit the solubility change after irradiation of the radiation (e.g. UV rays or electron beam) and post-exposure baking treatment, and have good resistance to oxygen plasma etching due to high silicon content, has been required.

Furthermore, as for conventional sulfonium salts, there has been known, for instance, low-molecular triarylsulfonium salts described in U.S. Pat. No. 4,374,066 and diaryliodonium salts described in U.S. Pat. No. 4,264,703. These salts were used as a cationic photopolymerization initiator (i.e. a photoacid generator). In addition, recently the sulfonium salts have been used as a sensitizer for photoresists (chemically amplified resists) in a photolithography process for fabricating very large scale integrated circuits.

As mentioned above, for the sake of the very fine processing in the semiconductor devices, the photoresist having good sensitivity to deep UV light having shorter wavelength has been required.

However, the conventional photoacid generators such as triarylsulfonium salts and diaryliodonium salts as mentioned above have a number of aromatic rings such as benzene rings therein and thus have very high absorption to the light in a short wavelength region of 200 nm or less. Therefore, a problem exists in that these polymers could not almost be used as the photoacid generator in a photosensitive composition (e.g. chemically amplified resist etc.) which is processed by applying, particularly, the light having short wavelengths of 200 nm or less, for instance, the light (wavelength: 193 nm ) from the ArF excimer laser. In addition, such photoacid generator itself had no resistance to the dry etching process using oxygen plasma.

SUMMARY OF THE INVENTION

Accordingly, an object of the present invention is to provide a novel polymer having silicon atoms and sulfonium salt units in their main chain. The polymers have photochemically acid-forming units (i.e. sulfonium salt units) and acid-labile and oxygen plasma etching resistance properties (silicons). The polymer has good efficiency of photoreaction, exhibits remarkable change in its solubility through a catalytic hydrolysis reaction of silyl ether bonds in the polymer main chain with acids formed by irradiation of radiation such as ultraviolet light, electron beam or the like to the polymer and the following post-exposure baking treatment, and has good resistance to oxygen plasma etching because of its high content of silicon atom.

Another object of the present invention is to provide a photoresist composition containing the above polymer having both silicon atoms and sulfonium salt units in its main chain.

Even another object of the present invention is to provide another polymer having silicon atoms and sulfonium salt units, in addition to the above properties, with high transparency to light of short wavelengths of 200 nm or less and high dry etching resistance to oxygen plasma, and which can be more efficiently used as a component of a photoresist for patterning with light less than or equal to 200 nm.

According to a first embodiment of the present invention, there is provided a novel first polymer having silicon atoms and sulfonium salt units which is obtained from a reaction between a polymer having silicon atoms and a diaryliodonium salt or an alkyl halide, i.e. a novel first polymer having silicon atoms and sulfonum salt units represented by the following general formula (I):

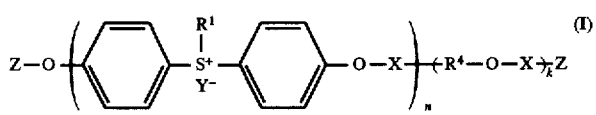

wherein n is a positive integer equal to 10 to 700 inclusive, k is 0 or a positive integer equal to 1 to 700 inclusive, the sum of n+k is a positive integer equal to 10 to 700 inclusive, the ratio of k/(n+k) is in the range of 0 to 0.9 inclusive, $Y^-$ represents a non-nucleophilic counter ion, $R^1$ is a radical selected from the group consisting of a phenyl group, $C_1$–$C_6$ alkyl-substituted phenyl group and $C_1$–$C_6$ alkyl group, $R^4$ is a divalent radical selected from the group consisting of a $C_2$–$C_8$ alkylene group and a phenylene group, Z is selected from a hydrogen atom or a trimethylsilyl group, and X is a divalent radical selected from the following general formula (II) or (III):

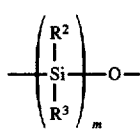

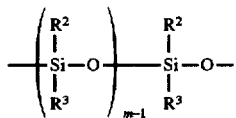

wherein m is a positive integer equal to 1 to 100 inclusive and $R^2$ and $R^3$ can be the same or different, each being a radical selected from the group consisting of a phenyl group, $C_1$–$C_6$ alkyl-substituted phenyl group and $C_1$–$C_6$ alkyl group.

In the above formula (I), n is preferably a positive integer equal to 10 to 200 inclusive and more preferably 10 to 100; k is preferably 0 or a positive integer equal to 1 to 200 inclusive and more preferably o to 100 inclusive; and the sum of n+k is preferably a positive integer equal to 10 to 200 inclusive and more preferably a positive integer equal to 10 to 100. In the above formulae (II) and (III), m is preferably a positive integer equal to 1 to 50 inclusive and more preferably 1 to 10 inclusive.

$Y^-$ includes, for instance, the non-nucleophilic counter ions such as $BF_4^-$, $AsF_6^-$, $SbF_6^-$, $PF_6^-$, $CF_3SO_3^-$, $Cl^-$, $Br^-$, $I^-$, $ClO_4^-$, $CH_3SO_3^-$ and the like. It is preferred that $Y^-$ is $BF_4^-$, $AsF_6^-$, $SbF_6^-$, $PF_6^-$ or $CF_3SO_3^-$.

$R^1$, $R^2$ and $R^3$ can be the same or different. In these substituents, the $C_1$–$C_6$ alkyl-substituted phenyl group includes, for instance, a tolyl group and the $C_1$–$C_6$ alkyl group may be linear or branched and includes, for instance, methyl, ethyl, n-propyl, i-propyl, n-butyl, i-butyl, s-butyl, t-butyl, pentyl and hexyl groups or the like.

As for $R^4$, the $C_2$–$C_8$ alkylene group includes, for instance, linear and branched $C_2$–$C_8$ alkylene groups such as ethylene, propylene, butylene, pentylene, hexylene, heptylene and octylene or the like; the $C_5$–$C_8$ cycloalkylene group such as 1,2-cyclopentylene, 1,4-cyclohexylene, 1,2-cyclohexylene and 1,5-cyclooctylene groups or the like; and 1,4-cyclohexanedimethylene group.

The polymer having silicon atoms and sulfonium salt units of the general formula (I) in which $R^1$ is the phenyl group or alkyl-substituted phenyl group is prepared, for instance, according to a Crivello et al.'s method relating to the preparation of triphenylsulfonium salt described in Journal of the Organic Chemistry, Vol.43, No.15, 3055–3058, 1978. Namely, the polymer is synthesized by reacting a polymer having silicon atoms of the following general formula (IV):

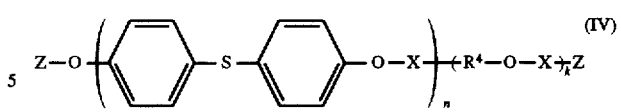

wherein X, n and k are as defined above, with a compound of the following general formula (VIII):

$$R^1-I^+-R^1 Y^-$$ (VIII)

wherein $R^1$ and $Y^-$ are as defined above.

The polymer represented by the general formula (IV) is synthesized, for instance, by a method as described below.

A silane derivative represented by the following general formula (V):

in which $R^2$, $R^3$ and m are as defined above or a siloxane derivative represented by the following general formula (VI):

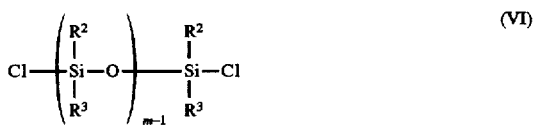

in which $R^2$, $R^3$ and m are as defined above, and 4,4'-thiodiphenol or a mixture of 4,4'-thiodiphenol and a diol compound represented by the following general formula (VII):

$$HO-R^4-OH$$ (VII)

in which $R^4$ is as defined above, and are heated to reflux in dry pyridine under an atmosphere of argon. After 1 to 6 hours at reflux, the reaction mixture is allowed to reprecipitate in methanol to obtain an intermediate polymer represented by the general formula (IV). As for the diol compound, there are used, for instance, ethylene glycol, 1,8-octanediol, 1,4-cyclohexanedimethanol or the like.

In case of using the mixture of 4,4'-thiodiphenol and the diol compound of the general formula (VII), if these compound are mixed in any desired proportions, there is obtained the polymer having silicon atoms of the general formula (IV) having an arbitrary ratio of n and k. Therefore, if this polymer is converted to a sulfonium salt, it is possible to obtain the polymer having silicon atoms and sulfonium salt units of the general formula (I), in which Z is a hydrogen atom, with an arbitrary content of sulfonium salts.

In addition, the polymer of the general formula (IV) in which Z is a trimethylsilyl group is synthesized by trimethylsilylating the hydroxyl groups at both ends of the polymer of the general formula (IV)(Z is the hydrogen atom) which is obtained according to the above-mentioned method, for instance, in dry tetrahydrofuran under the presence of a silylating agent such as hexamethyldisilazane or the like.

The polymer having silicon atoms (IV) obtained according to the above-mentioned method is mixed with a diaryliodonium salt derivative of the general formula (VIII), in which $R^1$ is a phenyl group or a $C_1$–$C_6$ alkyl-substituted phenyl group and $Y^-$ is as defined above, in the proportion of equal mole to 1.2 moles per a unit of sulfide of the polymer (IV). Then, the mixture is allowed to react at about 110°–150° C. for about 1–3 hours in a solvent (for instance, chlorobenzene, dichlorobenzene or the like) under an atmosphere of nitrogen and in the presence of a catalyst such as copper(II) benzoate, copper(II) acetate, copper(I) chloride or the like. At the end of the reaction, the product is washed with diethyl ether, dissolved in acetone, and then poured and reprecipitated into a great bulk of ether or hexane to obtain the polymer having silicon atoms and sulfonium salt units of the general formula (I) in which $R^1$ is the phenyl group or alkyl-substituted phenyl group.

The polymer having silicon atoms and sulfonium salt units of the general formula (I) in which $R^1$ is an alkyl group is prepared, for instance, by making use of a method of Reiser et al. relating to a low-molecular onium salt described in Journal of the Organic Chemistry, Vol.57, No.2, 759–761, 1992, the disclosure of which is hereby incorporated by reference herein. Namely, the polymer having silicon atoms of the general formula (IV) which was synthesized according to the above-mentioned method, alkyl halide of the following general formula (IX):

 (IX)

in which $R^1$ is a $C_1$–$C_6$ alkyl group and W is a halogen atom selected from the group consisting of iodine, bromine, chlorine or the like, and a metallic salt of organic acid of the following general formula (X):

 (X)

in which $M^+$ is a metal ion selected from $K^+$, $Na^+$ and $Ag^+$ and $Y^-$ is as defined above, are mixed in the ratio of equal mole and are allowed to react at room temperature for about 3–12 hours in methylene chloride. At the end of the reaction, insoluble metallic salts are removed by filtration and then the filtrate is poured and reprecipitated in a great bulk of ether to obtain the final product.

In addition, the polymer of formula (I), in which $R^4$ is as defined above exclusive of a phenyl group, has improved transparency to deep U.V. light, which is absorbed with respect to aromatic rings such as benzene rings, such as light from a KrF excimer laser or the like. However, the polymer of formula (I), in which n and k meet the following relation: $0.9<k/(n+k)\leq 1.0$, cannot be used for a photoresist composition because the product after being converted to a sulfonium salt is liquid.

If the above-mentioned polymer having both silicon atoms and sulfonium salt units are irradiated with radiation such as deep U.V. light, excimer laser beam (KrF, ArF or the like) or the like, acids are generated. In addition, if a thin film comprising the polymer having silicon atoms and sulfonium salt units of the general formula (I) and, for instance, poly(p-hydroxystyrene) in which hydroxy groups are partially modified with tert-butoxycarbonyl groups or tetrahydropyrane-2-yl groups is formed on a silicon substrate, is irradiated with KrF excimer laser beam and thereafter is subjected to post-exposure baking treatment, the dissolution velocity of the thin film becomes extremely high. Moreover, in the polymers according to the present invention, acid hydrolysis of the polymer by heating them takes place through acids generated by light irradiation, i.e. silyl ether bonds in the main chain of the polymer are broken to form silanol, whereby the solubility thereof in solvents is extremely varied and improved due to the remarkable decrease in molecular weight of the polymer by the decomposition of their main chain. Therefore, the polymers of the general formula (I) are utilized as photoacid generators for chemically amplified resists and further can be utilized as a base resin for resists and agents for inhibiting dissolution of resist and cationic photo-polymerization initiators.

Furthermore, the polymers of the general formula (I) according to the present invention have excellent resistance to oxygen plasma etching due to their high content of silicon atoms in the molecule. The etching resistance is improved as the number of silicon atoms per its constituent unit increases. Therefore, the polymers can be utilized for an upper layer in multilayer resist.

According to a second embodiment of the present invention, there is provided a novel second polymer having both silicon atoms and sulfonium salt units obtained from a polymer having silicon atoms, a metallic salt of an organic acid and an alkyl halide, i.e. a novel second polymer having both silicon atoms and sulfonium salt units represented by the following general formula (I'):

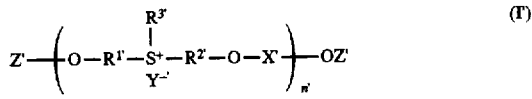 (I')

wherein n' is a positive integer equal to 1 to 300 inclusive, $Y^-$ represents a non-nucleophilic counter anion, $R^{1'}$ and $R^{2'}$ can be the same or different, each being a $C_2$–$C_{10}$ alkylene group, $R^{3'}$ is a $C_3$–$C_7$ 2-oxoalkyl group, Z' is selected from the group consisting of a hydrogen atom and a trimethylsilyl group, and X' is a divalent radical selected from the group consisting of the following general formulae (II') and (III'):

 (II')

 (III')

wherein m' is a positive integer equal to 1 to 100 inclusive and $R^{4'}$ and $R^{5'}$ can be the same or different, each being a radical selected from the group consisting of a $C_1$–$C_8$ alkyl group and a phenyl group.

In the above Formula (I'), it is preferred that n' is a positive integer equal to 20 to 150 inclusive. In the above formulae (II') and (III'), m' is preferably a positive integer equal to 1 to 50 inclusive and more preferably 1 to 10 inclusive.

$Y^-$ includes, for instance, the non-nucleophilic counter ions such as $BF_4^-$, $AsF_6^-$, $SbF_6^-$, $PF_6^-$, $CF_3SO_3^-$, $Cl^-$, $Br^-$, $I^-$, $ClO_4^-$, $CH_3SO_3^-$ and the like. It is preferred that $Y^-$ is $BF_4^-$, $AsF_6^-$, $SbF_6^-$, $PF_6^-$ or $CF_3SO_3^-$.

As for and $R^{1'}$ and $R^{2'}$, the $C_2$–$C_{10}$ alkylene group may be linear, branched or cyclic and includes, for instance, ethylene, propylene, butylene, pentylene, hexylene, heptylene, octylene, decanylene and cyclohexylene groups or the like.

As for $R^{3'}$, the $C_3$–$C_7$ 2-oxoalkyl group may be linear, branched or cyclic and includes, for instance, 2-oxopropyl, 2-oxobutyl, 2-oxopentyl, 2-oxohexyl, 2-oxocyclopentyl, 2-oxocyclohexyl and 2-oxocycloheptyl groups or the like.

As for $R^{4'}$ and $R^{5'}$, the $C_1$–$C_8$ alkyl group may be linear, branched or cyclic and includes, for instance, methyl, ethyl, i-propyl, n-propyl, n-butyl, i-butyl, s-butyl, t-butyl, pentyl, hexyl, heptyl, octyl, cyclopentyl, cyclohexyl, cycloheptyl and cyclooctyl groups or the like.

The polymer containing both silicon atoms and sulfonium salt units of the general formula (I') is prepared, for instance, by making use of the above method of Reiser et al. relating to the preparation of low-molecular onium salts described in Journal of the Organic Chemistry, Vol.57, No.2, 759–761, 1992, i.e. by carrying out the conversion reaction of the corresponding silicon-containing sulfide polymers to sulfonium salts. For instance, the sulfonium salts are prepared as follows. Namely, the polymer of the general formula (I') is synthesized by mixing a polymer having silicon atoms of the following general formula (IV'):

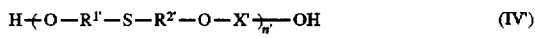
$$H+O-R^{1'}-S-R^{2'}-O-X'\underset{n'}{)}-OH \qquad (IV')$$

wherein $R^{1'}$; $R^{2'}$, $R^{4'}$, $R^{5'}$, X', n' and m' are as defined above, with an alkyl halide of the following general formula (VI):

$$R^{3'}-W' \qquad (V')$$

wherein $R^{3'}$ is as defined above and W' is a halogen atom such as iodine, bromine, chlorine or the like and a metallic salt of an organic acid of the following general formula (VI'):

$$M^{+1}Y^{-1} \qquad (VI')$$

wherein $M^{+'}$ is a metal selected from $K^+$, $Na^+$ and $Ag^+$ or the like and $Y^-$ is as defined above, in the equal molar ratio based on the sulfide group or in the slightly excess molar ratio of the alkyl halide (V') (the molar ratio based on the sulfide group of compound(V')/polymer(IV'): 1.0–1.5); and reacting the mixture, for instance, in a solvent such as methylene chloride or nitromethane and at room temperature or at reflux for about 3–12 hours. At the end of the reaction, insoluble metallic salts are removed by filtration and the filtrate is poured and reprecipitated in, for instance, ether to give the polymer of the general formula (I').

Derivatives of the polymer (I') having sulfonium residue in the proportion below 1.0 can be synthesized by repeating the above-mentioned procedures except for mixing of the polymer (I') in the molar ratio below the equal mole per a sulfide unit of the intermediate polymer (IV').

The polymer represented by the general formula (IV') is synthesized, for instance, by a method as described below.

A siloxane derivative represented by the following general formula (VII'):

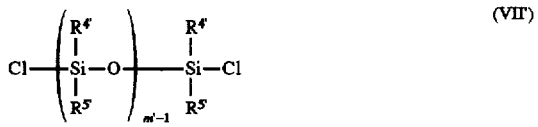

in which $R^{4'}$, $R^5$ and m' are as defined above or a silane derivative represented by the following general formula (VIII'):

in which $R^{4'}$, $R^{5'}$ and m' are as defined above, and ω, ω'-thiodialkanol(e.g. 2,2'-thiodiethanol or 3,3'-thiodipropanol or a mixture thereof) represented by the following general formula (IX'):

$$HO-R^{1'}-S-R^{2'}-OH \qquad (IX')$$

in which $R^{1'}$ and $R^{2'}$ are as defined above, are dissolved in the proportion of equal mole in dry pyridine and thereafter are heated to reflux in dry pyridine under an atmosphere of argon. In this case, a catalyst such as imidazole or the like may be added to the solution immediately before heating it. After about 1 to 6 hours at reflux, the reaction mixture is allowed to cool and then is poured and reprecipitated in methanol to obtain an intermediate polymer represented by the general formula (IV').

Moreover, the polymer of the general formula (I') in which Z' is a trimethylsilyl group is synthesized as follows. First, the polymer of the general formula (IV') in which Z' is a trimethylsilyl group is synthesized by trimethylsilylating hydroxyl groups at both ends of the polymer of the general formula (IV') (Z' is a hydrogen atom) which is obtained according to the above-mentioned method, for instance, in dry tetrahydrofuran under the presence of a silylating agent such as hexamethyldisilazane or the like. Then, the polymer (IV') thus obtained is converted to a polymer having silicon atoms and sulfonium salt units of the general formula (I') in the same manner as in the polymer of the general formula (I') in which Z' is a hydrogen atom to obtain the object polymer with Z' being a trimethylsilyl group.

Furthermore, the polymer of formula (I'), in which $R^{4'}$ and $R^{5'}$ are a $C_1-C_8$ alkyl group, has highly improved transparency to deep U.V. light, which is absorbed with respect to aromatic rings such as benzene rings, such as light from the KrF or ArF excimer laser or the like.

If the above-mentioned polymers containing silicon atoms and sulfonium salt units of the general formula (I') are irradiated with deep U.V. light, excimer laser beam (KrF (248 nm), ArF (193 nm) or the like) or the like, acids are generated. Moreover, in the polymers of the general formula (I') according to the present invention, acid hydrolysis takes place by heating through acids generated by light irradiation, i.e. silyl ether in the main chain of polymer is broken and converted to silanol, whereby the solubility thereof in solvents is extremely varied or improved due to remarkable decrease in molecular weight of the polymer. Therefore, the polymers of the general formula (I') are utilized as photoacid generators for chemically amplified type resists and further can be utilized as a base resin for resists and agents for inhibiting dissolution of the resists and cationic photopolymerization initiators for alkyl vinyl ether or the like.

Furthermore, the polymers of the general formula (I') according to the present invention have very excellent resistance to oxygen plasma etching because of high content of silicon atoms in the molecule. The etching resistance is improved as the number (m' in the general formula (I')) of silicon atoms per its constituent unit increases. Therefore, the polymers can be utilized for an upper layer in multilayer resist.

The foregoing and other objects and features of the present invention will be apparent from the following description.

DETAILED DESCRIPTION OF THE PREFERRED EMBODIMENTS

The present invention will be hereinafter be described in more detail with reference to the non-limiting working Examples given by way of illustration and the effects practically achieved by the present invention will also be discussed in more detail in comparison with Control Example.

EXAMPLE 1

In this Example, a polymer having silicon atoms and sulfonium salt units of general formula (I), in which $R^1$ represents a phenyl group, $Y^-$ represents $CF_3SO_3^-$, X represents general formula (III), both $R^2$ and $R^3$ represent a methyl group, Z represents a hydrogen atom, m is 3, n is 64 and k is zero, was synthesized as follows.

Three grams (13.7 mmol) of 4,4'-thiodiphenol were dissolved in 15 ml of dry pyridine, and 3.73 ml (13.7 mmol) of 1,5-dichloro-hexamethyltrisiloxane was added to the solution and agitated at room temperature for one hour. Thereafter, the mixture was heated at reflux for 5 hours. At the end of the reaction, the reaction mixture was dissolved in toluene and was reprecipitated in methanol to yield 5.94 g of a polymer (IV) (yield: 87%, weight-average molecular weight: 28,000). Then, 1 g of this polymer (IV) was dissolved in 10 ml of chlorobenzene, and 1.02 g of diphenyliodonium trifluoromethanesulfonate and 24 mg of copper benzoate were added to the solution and were agitated at 120°–130° C. for 3 hrs. under an atmosphere of argon. At the end of the reaction, the reaction mixture was allowed to cool and then was poured into ether to perform reprecipitation. White precipitate thus deposited was collected by filtration and was dried under reduced pressure for 12 hrs. to obtain 1.25 g of a polymer having silicon atoms and sulfonium salt units (yield: 82%). Structure of the final product was identified by $^1$H-NMR measurement (an AMX-400 type NMR apparatus manufactured by Bruker Co.), an IR measurement (IR-470 manufactured by Shimadzu Co.) and elemental analysis. Molecular weight was determined by using LC-9A of Shimadzu Co. and detection was performed by using SPD-6A of Shimadzu Co. and GPC column (GPC KF-80M) of Shouwa Denkou Co. in which tetrahydrofuran (refer to hereinafter as "THF") was used as a solvent.

$^1$H-NMR (acetone-d$_6$, internal standard: tetramethylsilane): δ (ppm) 0.12(s, 6H, methyl), 0.28(s, 12H, methyl), 6.77–7.07(m, 4H, aromatic), 7.20–7.67(m, 9H, aromatic)

IR (KBr tablet, cm$^{-1}$) 2950($v_{C-H}$(CH$_3$)), 1580($v_{C=C}$ (phenyl)), 1288($v_{Si-C}$), 1243, 1225($v_{C-F}$), 835($v_{C-H}$(phenyl))

Weight-Average Molecular Weight: 42,000

Elemental Analysis:

|  | C | H | S | F |
|---|---|---|---|---|
| Found (% by weight): | 46.37 | 4.53 | 9.59 | 8.90 |
| Calculated (% by weight): | 46.28 | 4.82 | 9.88 | 8.78 |

EXAMPLES 2–4

In these Example, the same procedures as used in Example 1 were repeated to synthesize desired final products, except that 1,5-dichloro-hexamethyltrisiloxane was replaced with the following silicon compounds(Table 1). Structure of each of the final products was identified by the same analysis method as in Example 1. Table 1 shows total yields and elemental analysis of the final products.

TABLE 1

| Ex. Silicon Compound | Elemental Analysis[1] (% by weight) | | | | Yield % |
|---|---|---|---|---|---|
|  | C | H | S | F |  |
| 2 1,7-dichloro-octa-methyltetrasiloxane | 44.64 (44.85) | 5.01 (5.16) | 6.59 (6.67) | 7.79 (7.66) | 70 |
| 3 1,3-dichloro-tetra-methyldisiloxane | 48.37 (48.07) | 4.03 (4.38) | 11.29 (11.16) | 9.78 (9.92) | 72 |
| 4 1,3-dichloro-tetra- | 62.67 | 4.00 | 7.49 | 6.79 | 80 |

TABLE 1-continued

| Ex. Silicon Compound | Elemental Analysis[1] (% by weight) | | | | Yield % |
|---|---|---|---|---|---|
|  | C | H | S | F |  |
| phenyldisiloxane | (62.76) | (4.04) | (7.79) | (6.92) |  |

[1]Values in the parenthesis correspond to calculated values.

EXAMPLE 5

In this Example, a polymer having silicon atoms and sulfonium salt units of general formula (I), in which $R^1$ represents a phenyl group, $Y^-$ represents $CF_3SO_3^-$, X represents general formula (II), both $R^2$ and $R^3$ represent a methyl group, Z represents a hydrogen atom, m is 1, n is 92 and k is zero, was synthesized as follows.

Five grams (22.9 mmol) of 4,4'-thiodiphenol were dissolved in 25 ml of dry pyridine, and 2.78 ml (22.9 mmol) of dimethyldichlorosilane was added to the solution and agitated at room temperature for one hour. Thereafter, the mixture was heated at reflux for 5 hours. At the end of the reaction, the reaction mixture was dissolved in toluene and was poured and reprecipitated in methanol to yield 5.63 g of a polymer (yield: 90%, weight-average molecular weight: 27,000).

Then, 1 g of this polymer was dissolved in 10 ml of chlorobenzene, and 1.57 g of diphenyliodonium trifluoromethanesulfonate and 37 mg of copper benzoate were added to the solution and were agitated at 120°–130° C. for 3 hrs. under an atmosphere of argon. At the end of the reaction, the reaction mixture was allowed to cool and then was poured into ether to perform reprecipitation. White precipitate thus deposited was collected by filtration and was dried under reduced pressure for 12 hrs. to obtain 1.6 g of a polymer having silicon atoms and sulfonium salt units (yield: 88%). Structure of the final product was identified in the same manner as in Example 1.

$^1$H-NMR (acetone-d$_6$, internal standard: tetramethylsilane): δ (ppm) 0.13(s, 6H, methyl), 6.75–7.02 (m, 4H, aromatic), 7.18–7.64 (m, 9H, aromatic)

IR (KBr tablet, cm$^{-1}$) 2955($v_{C-H}$(CH$_3$)), 1578($v_{C=C}$ (phenyl)), 1280($v_{Si-C}$), 1240, 1223($v_{C-F}$), 838($v_{C-H}$(phenyl))

Weight-Average Molecular Weight: 47,600

Elemental Analysis:

|  | C | H | S | F |
|---|---|---|---|---|
| Found (% by weight): | 50.47 | 3.63 | 12.59 | 11.60 |
| Calculated (% by weight): | 50.39 | 3.83 | 12.81 | 11.39 |

EXAMPLES 6 and 7

The same procedures as used in Example 5 were repeated to synthesize desired final products, except that the dimethyldichlorosilane was replaced with the following silicon compounds(Table 2). Structure of each of the final products was identified by the same analysis method as in Example 1. Table 2 shows total yields and elemental, analysis of the final products.

TABLE 2

| Example | Silicon Compound | Elemental Analysis[1] (% by weight) | | | Yield % |
|---|---|---|---|---|---|
| | | C | H | S | |
| 6 | Diethyldichloro-silane | 51.37 (51.14) | 6.03 (6.20) | 7.28 (7.68) | 70 70 |
| 7 | Diphenyldichloro-silane | 51.37 (51.14) | 6.03 (6.20) | 7.29 (7.58) | 76 |

[1]Values in the parenthesis correspond to calculated values.

EXAMPLE 8

In this Example, a polymer having silicon atoms and sulfonium salt units of general formula (I), in which $R^1$ represents a phenyl group, $Y^-$ represents $CF_3SO_3^-$, X represents general formula (II), both $R^2$ and $R^3$ represent a methyl group, Z represents a trimethylsilyl group, and m is 3, was synthesized as follows.

First, 2.03 g of the polymer (IV)(wherein X represents general formula (III), both $R^2$ and $R^3$ represent a methyl group, Z represents a hydrogen atom and m is 3) was dissolved in 5 ml of dry THF, and 0.2 ml of hexamethyldisilazane was added to the solution. Thereafter, the mixture was heated at 70° C. with agitating and was subjected to reaction for 2 hrs. At the end of the reaction, the reaction mixture was diluted with 30 ml of dry THF and poured in dry ethanol. Precipitate thus deposited was recovered and dried under reduced pressure for 12 hrs. to obtain 1.72 g (yield: 86.2%) of a polymer having end groups each of which was end-capped with a trimethylsilyl group.

Then, 1.5 g of this polymer was dissolved in 3 ml of chlorobenzene, and 1.49 g of diphenyl-iodonium trifluoromethanesulfonate and 7 mg of copper benzoate were added to the solution and were agitated at 120°–130° C. for 3 hrs. under an atmosphere of argon. At the end of the reaction, the reaction mixture was allowed to cool and then was poured into ether to perform reprecipitation. White precipitate thus deposited was collected by filtration and was dried under reduced pressure for 12 hrs. to obtain 2.14 g of a polymer having silicon atoms and sulfonium salt units (yield: 94%). Structure of the final product was identified in the same manner as in Example 1. The results of elemental analysis are as follows.

Elemental Analysis:

| | C | H | S | F |
|---|---|---|---|---|
| Found (% by weight): | 46.50 | 4.98 | 9.71 | 9.13 |
| Calculated (% by weight): | 46.26 | 4.85 | 9.82 | 8.73 |

EXAMPLE 9

In this Example, a polymer having silicon atoms and sulfonium salt units of general formula (I) in which $R^1$ represents a phenyl group, $Y^-$ represents $CF_3SO_3^-$, X represents general formula (III), both $R^2$ and $R^3$ represent a methyl group, $R^4$ represents a 1,4-cyclohexylene group, Z represents a trimethylsilyl group, m is 4, n is 34, k is 34 and a ratio of n to k is 1:1, was synthesized as follows.

First, 3.13 g (14.35 mmol) of 4,4'-thiodiphenol and 1.66 g (14.35 mmol) of 1,4-cyclohexanediol were dissolved in 30 ml of dry pyridine, and 10 ml (28.7 mmol) of 1,7-dichlorooctamethyltetrasiloxane was added to the solution and agitated at room temperature for one hour. Thereafter, the mixture was heated at reflux for 5 hours. At the end of the reaction, the reaction mixture was dissolved in toluene and was reprecipitated in methanol to yield 10.49 g of a polymer (yield: 82%, weight-average molecular weight: 31,000).

Then, 5 g of this polymer were dissolved in 20 ml of dry THF and 0.3 ml of hexamethyl-disilazane were added to the solution. Thereafter, the mixture was heated at 70° C. with agitating and was subjected to reaction for 2 hrs. At the end of the reaction, the reaction mixture was poured in dry ethanol. Precipitate thus deposited was recovered and dried under reduced pressure for 12 hrs. to obtain 4.45 g (yield: 89%) of a polymer having end groups each of which was end-capped with a trimethylsilyl group.

Then, 1 g of the resulting polymer was dissolved in 10 ml of chlorobenzene, and 0.21 g of diphenyl-iodonium trifluoromethanesulfonate and 2.1 mg of copper benzoate were added to the solution and were agitated at 120°–130° C. for 3 hrs. under an atmosphere of argon. At the end of the reaction, the reaction mixture was allowed to cool and then was poured into ether to perform reprecipitation. White precipitate thus deposited was collected by filtration and was dried under reduced pressure for 12 hrs. to obtain 0.98 g of a polymer having silicon atoms and sulfonium salt units (yield: 79%). Structure of the final product was identified in the same manner as in Example 1.

$^1$H-NMR (acetone-$d_6$, internal standard: tetramethylsilane): δ (ppm) 0.12(s, 12H, methyl), 0.28(s, 12H, methyl), 2.05–2.73 (s, 4H, methylene), 4.34–4.75(s, 1H, methine), 6.77–7.07 (m, 1H, aromatic), 7.20–7.67 (m, 1, 6H, aromatic)

IR (KBr tablet, cm$^{-1}$) 2950($v_{C-H}$(—$CH_2$—, $CH_3$)), 1580 ($v_{C=C}$(phenyl)), 1288 ($v_{Si-C}$) 1243, 1225($v_{C-F}$), 835($v_{C-H}$(phenyl))

Weight-Average Molecular Weight: 37,800

Elemental Analysis:

| | C | H | S | F |
|---|---|---|---|---|
| Found (% by weight): | 50.33 | 7.33 | 3.44 | 5.90 |
| Calculated (% by weight): | 50.31 | 7.26 | 3.27 | 5.82 |

EXAMPLE 10

The same procedures as used in Example 9 were repeated to synthesize a desired final product, except that 1,4-cyclohexanediol was replaced with hydroquinone, n is 28 and k is 28. Structure of the final product was identified by the same analysis method as in Example 1.

$^1$H-NMR (acetone-$d_6$, internal standard: tetramethylsilane): δ (ppm)

0.12(s, 12H, methyl), 0.28(s, 12H, methyl), 6.7(s, 2H, aromatic), 6.77–7.07(m, 2.5H, aromatic), 7.20–7.67(m, 4H, aromatic)

IR (KBr tablet, cm$^{-1}$) 2950($v_{C-H}$($CH_3$)), 1580($v_{C=C}$ (phenyl)), 1288($v_{Si-C}$), 1243, 1225($v_{C-F}$), 835($v_{C-H}$(phenyl))

Weight-Average Molecular Weight: 31,000

Elemental Analysis:

| | C | H | S | F |
|---|---|---|---|---|
| Found (% by weight): | 45.33 | 5.93 | 2.44 | 5.35 |
| Calculated (% by weight): | 45.68 | 6.04 | 2.14 | 5.29 |

EXAMPLE 11

In this Example, a polymer having silicon atoms and sulfonium salt units of general formula (I), in which $R^1$ represents a phenyl group, Y⁻ represents $CF_3SO_3^-$, X represents general formula (III), both $R^2$ and $R^3$ represent a methyl group, $R^4$ represents an ethylene group, Z represents a hydrogen atom, m is 4, n is 47, k is 12 and a ratio of n to k is 4:1 was synthesized as follows.

First, 4.71 g (21.6 mmol) of 4,4'-thiodiphenol and 0.3 ml (5.4 mmol) of ethylene glycol were dissolved in 30 ml of dry pyridine, and 9.4 ml (27 mmol) of 1,7-dichloro-octamethyltetrasiloxane was added to the solution and agitated at room temperature for one hour. Thereafter, the mixture was heated at reflux for 5 hours. At the end of the reaction, the reaction mixture was dissolved in toluene and was poured and reprecipitated in methanol to yield 10.19 g of a polymer (yield: 79% weight-average molecular weight: 28,000).

Then, 5 g of this polymer was dissolved in 20 ml of dry THF and 0.3 ml of hexamethyl-disilazane was added to the solution. Thereafter, the mixture was heated at 70° C. with agitating and was subjected to reaction for 2 hrs. At the end of the reaction, the reaction mixture was poured in dry ethanol. Precipitate thus deposited was recovered and dried under reduced pressure for 12 hrs. to obtain 4.41 g (yield: 90%) of a polymer having end groups each of which was end-capped with a trimethylsilyl group.

Then, 1 g of the resulting polymer was dissolved in 10 ml of chlorobenzene, and 0.8 g of diphenyl-iodonium trifluoromethanesulfonate and 8.8 mg of copper benzoate were added to the solution and were agitated at 120°–130° C. for 3 hrs. under an atmosphere of argon. At the end of the reaction, the reaction mixture was allowed to cool and then was poured into ether to perform reprecipitation. White precipitate thus deposited was collected by filtration and was dried under reduced pressure for 12 hrs. to obtain 1.18 g (yield: 88%) of a polymer having silicon atoms and sulfonium salt units. Structure of the final product was identified in the same manner as in Example 1.

$^1$H-NMR (acetone-$d_6$ internal standard: tetramethylsilane): δ (ppm) 0.12(s, 12H, methyl), 0.28(s, 12H, methyl), 4.35–4.88 (s, 2H, methylene), 6.77–7.07(m, 2.5H, aromatic), 7.20–7.67(m, 4H, aromatic)

IR (KBr tablet, cm⁻¹) 2950($v_{C-H}(CH_3)$), 1580($v_{C=C}$ (phenyl)), 1288($v_{Si-C}$), 1243, 1225$v_{C-F}$), 835($v_{C-H}$(phenyl))

Weight-Average Molecular Weight: 38,000

Elemental Analysis:

|  | C | H | S | F |
|---|---|---|---|---|
| Found (% by weight): | 49.33 | 5.95 | 3.08 | 7.34 |
| Calculated (% by weight): | 49.37 | 5.84 | 3.19 | 7.57 |

EXAMPLE 12

The same procedures as used in Example 11 were repeated to synthesize a desired final product, except that ethylene glycol was replaced with 1,8-octanediol, n is 37, k is 9 and a ratio of n to k 4:1. Structure of the final product having yield of 82% was identified by the same analysis method as in Example 1.

$^1$H-NMR (acetone-$d_6$, internal standard: tetramethylsilane): δ (ppm) 0.12(s, 12H, methyl), 0.28(s, 12H, methyl), 6.7(s, 2H, aromatic), 6.77–7.07(m, 2.5H, aromatic), 7.20–7.67(m, 4H, aromatic)

IR (KBr tablet, cm⁻¹) 2950($v_{C-H}(CH_3)$), 1580($v_{C=C}$ (phenyl)), 1288($v_{Si-C}$), 1243, 1225$v_{C-F}$), 835($v_{C-H}$(phenyl))

Weight-Average Molecular Weight: 31,000

Elemental Analysis:

|  | C | H | S | F |
|---|---|---|---|---|
| Found (% by weight): | 45.33 | 5.93 | 2.44 | 5.35 |
| Calculated (% by weight): | 45.68 | 6.04 | 2.14 | 5.29 |

EXAMPLE 13

A spin coating film was formed, on a $SiO_2$ substrate, of a solution (8 wt. %) of the final product of Example 1 in acetonitrile according to a conventional spin coating method (revolution: 750 rpm for 20 seconds, and 3000 rpm for 40 seconds) and was dried on a hot plate at 120° C. for 90 seconds. After irradiating the film (film thickness: 1 μm) thus formed with KrF excimer laser beams (MEX excimer laser manufactured by NEC Corporation)(exposure area: 1 cm²), the exposed portion of the film was dissolved in an acetonitrile solution containing sodium salt of tetrabromophenol Blue as a indicator (concentration : 32 μm), and then the solution was diluted with acetonitrile to 20 ml and visible light absorption spectra were measured on the diluted solution. An acid generated was determined on the basis of change in absorbance at 619 nm according to the method described in Analytical Chemistry, Vol.48, No.2, 450–451, 1976, the disclosure of which is hereby incorporated by reference herein. With regard to the relation between molar number and absorbance of acid, calibration was previously made from absorbances of the known amounts of p-toluenesulfonic acid and the acetonitrile solution as an indicator, and the calibration curve was used in the determination of acid.

It is identified by the above-mentioned determination that 20 nmol of acid was generated by irradiating the product of Example 1 with 80 mJ·cm⁻² of exposure amount.

EXAMPLE 14

First, 2 g of the final product obtained in Example 1 and 18 g of poly(p-hydroxystyrene) in which 35% of hydroxy groups were modified with tert-butoxycarbonyl group and having 30,000 of weight-average molecular weight were dissolved in 80 g of methylisobutylketone and the solution was filtered by a membrane filter having 0.2 μm holes. Then, the resulting solution was coated on a silicon substrate by a conventional spin coating method to form a film having a thickness of 1 μm and the film was prebaked on a hot plate at 120° C. for 90 seconds. The prebaked film was then dipped in an aqueous solution of 3.25 wt. % tetramethylammonium hydroxide (referred to hereinafter as "TMAH") and the velocity of dissolution of the film therein was measured.

Next, another film was made in the same manner as mentioned above. After irradiating the film with the KrF excimer laser beam (MEX excimer laser manufactured by NEC Corporation)(exposure amount: 30 mJ·cm⁻¹), the exposed film was post-baked at 110° C. for 60 seconds. Then, the film was dipped in 3.25 wt. % TMAH and the dissolution velocity of the film was measured. The results show that the dissolution velocity of the exposed film was 150 times as much as that of the film before being exposed.

EXAMPLE 15

First, 2 g of the final product obtained in Example 1 and 18 g of poly(p-hydroxystyrene) in which 35% of hydroxy groups were modified with tert-butoxycarbonyl groups and having 30,000 of weight-average molecular weight were dissolved in 80 g of methylisobutylketone and then the solution was filtered by a membrane filter having 0.2 μm holes to prepare a resist solution.

The resist solution thus prepared was coated on a silicon substrate by the spin coating method to form a film having a thickness of 1 μm, and the resulting film was prebaked on a hot plate at 120° C. for 90 seconds to form a resist layer. The resist layer was exposed to light using a KrF excimer laser beam (MEX excimer laser manufactured by NEC Corporation) as a light source and a KrF excimer laser stepper (numerical aperture: 0.42) and thereafter post-baked at 110° C. for 60 seconds. Next, the wafer was dipped in 3.25 wt. % TMAH for 60 seconds to perform development and then was dipped in isopropyl alcohol for 30 seconds to perform rinsing. In this case, the sensitivity was 40 mJ·cm$^{-2}$ and the minimum resolution was 0.45 μmL/S.

EXAMPLE 16

The same procedures as used in Example 13 were repeated except that the light source was replaced with an ArF excimer laser (HE-460-SM-A type manufactured by Lumonics Co.). As a result, it was identified that 40 nmol of acid was generated by irradiation of 40 mJ·cm$^{-1}$.

EXAMPLE 17

In this Example, a polymer having silicon atoms and sulfonium salt units of general formula (I), in which $R^1$ represents a phenyl group, $Y^-$ represents $CF_3SO_3^-$, X represents general formula (III), both $R^2$ and $R^3$ represent a methyl group, $R^4$ represents a 1,4-cyclohexylene group, Z represents a hydrogen atom, m is 4, n is 14, k is 57 and a ratio of n to k is 1:4, was synthesized as follows.

First, 1.25 g (5.7 mmol) of 4,4'-thiodiphenol and 2.67 g (23 mmol) of 1,4-cyclohexanediol were dissolved in 30 ml of dry pyridine, and 10 ml (28.7 mmol) of 1,7-dichloro-octamethyl-tetrasiloxane was added to the solution and agitated at room temperature for one hour. Thereafter, the mixture was heated at reflux for 5 hours. At the end of the reaction, the reaction mixture was dissolved in toluene and was poured and reprecipitated in methanol to yield 11.21 g of a polymer (yield: 82%, weight-average molecular weight: 30,000).

Then, 5 g of this polymer was dissolved in 20 ml of dry THF and 0.3 ml of hexamethyl-disilazane was added to the solution. Thereafter, the mixture was heated at 70° C. with agitating and was subjected to reaction for 2 hrs. At the end of the reaction, the reaction mixture was poured in dry methanol. Precipitate thus deposited was recovered and dried under reduced pressure for 12 hrs. to obtain 4.66 g (yield: 89%) of a polymer having end groups each of which was end-capped with a trimethylsilyl group.

Then, 1 g of the resulting polymer was dissolved in 10 ml of chlorobenzene, and 0.21 g of diphenyl-iodonium trifluoromethanesulfonate and 2.1 mg of copper benzoate were added to the solution and were agitated at 120°–130° C. for 3 hrs. under an atmosphere of argon. At the end of the reaction, the reaction mixture was allowed to cool and then was poured into n-hexane to perform reprecipitation. Supernatant liquid was removed by decantation and the remaining residue was dried under reduced pressure to obtain 0.89 g of a powdery polymer having silicon atoms and sulfonium salt units (yield: 82%). Structure of the final product was identified in the same manner as in Example 1.

$^1$H-NMR (acetone-d$_6$, internal standard: tetramethylsilane): δ (ppm) 0.12(s, 12H, methyl), 0.28(s, 12H, methyl), 2.05–2.73 (m, 6.4H, methylene), 4.34–4.75(s, 1.6H, methine), 6.77–7.07(m, 1H, aromatic), 7.20–7.67(m, 1.6H, aromatic)

IR (KBr tablet, cm$^{-1}$) 2950($v_{C-H}$(—CH$_2$—, CH$_3$)), 1580 ($v_{C=C}$(phenyl)), 1288 ($v_{Si-C}$), 1243, 1225($v_{C-F}$), 835($v_{C-H}$(phenyl))

Weight-Average Molecular Weight: 33,000

Elemental Analysis:

| | C | H | S | F |
|---|---|---|---|---|
| Found (% by weight): | 44.78 | 7.08 | 1.21 | 2.55 |
| Calculated (% by weight): | 44.01 | 7.29 | 1.06 | 2.52 |

EXAMPLE 18

In this Example, a polymer having silicon atoms and sulfonium salt units of general formula (I), in which $R^1$ represents a phenyl group, $Y^-$ represents $CF_3SO_3^-$, X represents general formula (III), both $R^2$ and $R^3$ represent a methyl group, $R^4$ represents a 1,4-cyclohexanedimethylene group, Z represents a trimethylsilyl group, m is 4, n is 28, k is 28 and a ratio of n to k is 1:1, was synthesized as follows.

The same procedures as used in Example 9 were repeated to synthesize a final powdery product, except that 1.66 g (14.35 mmol) of 1,4-cyclohexanediol was replaced with 2.06 g (14.35 mmol) of 1,4-cyclohexanedimethanol. Structure of the final product having yield of 70% was identified by the same analysis method as in Example 1.

IR (KBr tablet, cm$^{-1}$) 2950($v_{C-H}$(—CH$_2$—, CH$_3$)), 1581 ($v_{C=C}$(phenyl)), 1287 ($v_{Si-C}$), 1242, 1223($v_{C-F}$), 832($v_{C-H}$(phenyl))

Weight-Average Molecular Weight: 32,000

Elemental Analysis:

| | C | H | S | F |
|---|---|---|---|---|
| Found (% by weight): | 46.90 | 7.05 | 2.77 | 5.25 |
| Calculated (% by weight): | 46.32 | 6.91 | 2.87 | 5.12 |

EXAMPLE 19

In this Example, a polymer having silicon atoms and sulfonium salt units of general formula (I), in which $R^1$ represents a tolyl group, $Y^-$ represents $CF_3SO_3^-$, X represents general formula (III), both $R^2$ and $R^3$ represent a methyl group, Z represents a hydrogen atom, m is 3, n is 64 and k is zero, was synthesized as follows.

The same procedures as used in Example 1 were repeated to synthesize a final product, except that 1.02 g (0.0024 mol) of diphenyliodonium trifluoromethanesulfonate was replaced with 1.09 g (0.0024 mol) of ditolyliodonium trifluoromethanesulfonate. Structure of the final product (1.19 g; yield: 75%) was identified by the same analysis method as in Example 1.

Weight-Average Molecular Weight: 42,800

Elemental Analysis:

| | C | H | S | F |
|---|---|---|---|---|
| Found (% by weight): | 47.52 | 5.23 | 9.61 | 8.15 |

17
-continued

|  | C | H | S | F |
|---|---|---|---|---|
| Calculated (% by weight): | 47.11 | 5.02 | 9.67 | 8.60 |

CONTROL EXAMPLE 1

In this Control Example, a polymer having silicon atoms and sulfonium salt units of general formula (I), in which $R^1$ represents a phenyl group, $Y^-$ represents $CF_3SO_3^-$, X represents general formula (III), both $R^2$ and $R^3$ represent a methyl group, $R^4$ represents a 1,4-cyclohexylene group, Z represents a hydrogen atom, m is 4, n is 4, k is 76 and a ratio of n to k is 5:95, was synthesized as follows.

First, 0.63 g (2.88 mmol) of 4,4'-thiodiphenol and 6.33 g (54.4 mmol) of 1,4-cyclohexanediol were dissolved in 30 ml of dry pyridine, and 20 ml (57.4 mmol) of 1,7-dichloro-octamethyltetrasiloxane was added to the solution and agitated at room temperature for one hour. Thereafter, the mixture was heated at reflux for 5 hours. At the end of the reaction, the reaction mixture was dissolved in toluene and was poured and reprecipitated in methanol to yield 20.21 g of a polymer (yield: 88%, weight-average molecular weight: 31,500).

Then, 5 g of this polymer were dissolved in 20 ml of dry THF and 0.3 ml of hexamethyl-disilazane was added to the solution. Thereafter, the mixture was heated at 70° C. with agitating and was subjected to reaction for 2 hrs. At the end of the reaction, the reaction mixture was poured in dry methanol. Precipitate thus formed was recovered and dried under reduced pressure for 12 hrs. to obtain 4.51 g (yield: 90%) of a polymer having end groups each of which was end-capped with a trimethylsilyl group.

Then, 1 g of the resulting polymer was dissolved in 10 ml of chlorobenzene, 0.105 g of diphenyl-iodonium trifluoromethanesulfonate and 1.1 mg of copper benzoate were added to the solution and were agitated at 120°–130° C. for 3 hrs. under an atmosphere of argon. At the end of the reaction, the reaction mixture was allowed to cool and then was poured into ether to perform reprecipitation. Supernatant liquid was removed by decantation and the remaining residue was dried under reduced pressure to obtain 0.73 g of a liquid polymer having silicon atoms and sulfonium salt units (yield: 70%). Structure of the final product was identified in the same manner as in Example 1.

$^1$H-NMR (acetone-$d_6$, internal standard: tetramethylsilane): δ (ppm) 0.12(s, 12H, methyl), 0.28(s, 12H, methyl), 2.05–2.73 (s, 6.4H, methylene), 4.34–4.75(m, 1.6H, methylene), 6.77–7.07(m, 1H, aromatic), 7.20–7.67 (m, 1.6H, aromatic)

IR (KBr tablet, cm$^{-1}$) 2950($v_{C-H}$(—CH$_2$—, CH$_3$)), 1580 ($v_{C=C}$(phenyl)), 1288 ($v_{Si-C}$) 1243, 1225($v_{C-F}$), 835($v_{C-H}$ (phenyl))

Weight-Average Molecular Weight: 33000
Elemental Analysis:

|  | C | H | S | F |
|---|---|---|---|---|
| Found (% by weight): | 44.78 | 7.08 | 1.21 | 2.55 |
| Calculated (% by weight): | 44.01 | 7.29 | 1.06 | 2.52 |

EXAMPLE 20

In this Example, a polymer having silicon atoms and sulfonium salt units of general formula (I), in which both $R^{1'}$ and $R^{2'}$ represent an ethylene group, $R^{3'}$ represents a 2-oxocyclohexyl group, $Y^-$ represents $CF_3SO_3^-$, X' represents general formula (III'), both $R^{4'}$ and $R^{5'}$ represent a methyl group, Z' represents a hydrogen atom, m' is 4 and n' is 53, was synthesized as follows.

First, 3.51 g of 2,2'-thiodiethanol was dissolved in 50 ml of dry pyridine in a 300 ml three-necked flask equipped with a reflux condenser and three-way cock and purged with argon, and 10 ml of 1,7-dichloro-octamethyltetrasiloxane was added to the solution gradually and agitated at room temperature for one hour. Thereafter, the mixture was agitated for 5 hours in a 70° C. bath with heating. At the end of the reaction, the reaction mixture was dissolved in dichloromethane, washed with water and thereafter poured into a large bulk of methanol. After decanting off supernatant liquid, the remaining liquid precipitate was dried under reduced pressure overnight to yield 8.28 g of a polymer (IV') (yield: 83%, weight-average molecular weight: 27,000, n=67).

Then, 2.1 g of this polymer was charged into a 300 ml four-necked flask, and 50 ml of a solution of 2-bromocyclohexanone 0.685 g (0.005 mol) in nitromethane were dropped therein. After agitating for 2 hrs., 100 ml of a solution of silver trifluoromethanesulfonate 1.285 g (0.005 mol) in nitromethane was added thereto dropwise and agitated for 3 hrs. At the end of the reaction, precipitate of silver bromide thus formed was filtered off with a glass filter (G4) and the solvent was distilled off from the filtrate under reduced pressure to concentrate it to about 50 ml. The resulting concentrate was poured into a large bulk of dry ether. After decanting off the supernatant liquid, the residue was dried under reduced pressure overnight to obtain 2.58 g of a polymer having silicon atoms and sulfonium salt units (yield: 78%). Structure of the final product was identified in the same manner as in Example 1.

$^1$H-NMR (acetone-$d_6$, internal standard: tetramethylsilane): δ (ppm) 0.12(s, 12H), 0.24(s, 12H), 1.73–1.85(m, 4H), 1.90–2.24(m, 2H), 2.53–2.58(m, 2H), 2.67–2.77(m, 1H), 3.04–3.11(m, 8H), 5.05–5.10(m, 1H)

IR (KBr tablet, cm$^{-1}$) 3040($v_{C-H}$), 1710($v_{C=O}$), 1264($v_{C-F}$) 1160($v_{SO_3}$) 1100($v_{Si-O-Si}$), 1030($v_{SO_3}$)

Weight-Average Molecular Weight: 31,500
Elemental Analysis:

|  | C | H | S | F | Si |
|---|---|---|---|---|---|
| Found (% by weight): | 35.02 | 6.03 | 9.56 | 8.95 | 17.33 |
| Calculated (% by weight): | 34.44 | 6.19 | 9.67 | 8.61 | 17.85 |

EXAMPLE 21

The same procedures as in Example 20 were repeated to obtain a final product, except that 0.35 g of imidazole was added to the solution of 2,2'-thiodiethanol and 1,7-dichloro-octamethyltetrasiloxane immediately before it was heated to 70° C. There was obtained a polymer having silicon atoms and sulfonium salt units having 101,000 of weight-average molecular weight and 169 of n'.

$^1$H-NMR (acetone-$d_6$, internal standard: tetramethylsilane): δ (ppm) 0.12(s, 12H), 0.24(s, 12H), 1.73–1.85(m, 4H), 1.90– 2.24(m, 2H), 2.53–2.58(m, 2H), 2.67–2.77(m, 1H), 3.04–3.11(m, 8H), 5.05–5.10(m, 1H)

IR (KBr tablet, cm$^{-1}$) 3040($v_{C-H}$), 1710($v_{C=O}$), 1264($v_{C-F}$), 1160($v_{SO_3}$) 1100($_{Si-O-Si}$), 1030($v_{SO_3}$)

Elemental Analysis:

|  | C | H | S | F |
|---|---|---|---|---|
| Found (% by weight): | 34.88 | 6.40 | 9.45 | 8.25 |
| Calculated (% by weight): | 34.44 | 6.19 | 9.67 | 8.61 |

EXAMPLE 22

In this Example, a polymer having silicon atoms and sulfonium salt units of general formula (I'), in which $R^{1'}$ and $R^{2'}$ represent a propylene group, $R^{3'}$ represents a 2-oxocyclohexyl group, $Y^-$ represents $CF_3SO_3^-$, X' represents general formula (II'), both $R^{4'}$ and $R^{5'}$ represent a methyl group, Z' represents a hydrogen atom, m' is 4 and n' is 46, was synthesized according to the same procedures as in Example 20, except that 3.51 g of 2,2'-thiodiethanol was replaced with 4.2 g of 3'-thiodipropanol.

$^1$H-NMR (acetone-$d_6$, internal standard: tetramethylsilane): δ (ppm) 0.12(s, 12H), 0.24(s, 12H), 1.73–1.85(m, 8H), 1.90–2.24(m, 2H), 2.53–2.58(m, 2H), 2.67–2.77(m, 1H), 3.04–3.13(m, 8H), 5.05–5.10(m, 1H)

IR (KBr tablet, cm$^{-1}$) 3040($v_{C-H}$) 1710($v_{C=O}$), 1264($v_{C-F}$), 1160($v_{SO_3}$) 1100($v_{Si-O-Si}$), 1030($v_{SO_3}$)

Weight-Average Molecular Weight: 28,500

Elemental Analysis:

|  | C | H | S | F |
|---|---|---|---|---|
| Found (% by weight): | 36.31 | 6.89 | 8.95 | 7.98 |
| Calculated (% by weight): | 36.73 | 6.56 | 9.32 | 8.31 |

EXAMPLE 23

In this Example, a polymer having silicon atoms and sulfonium salt units of general formula (I'), in which $R^{1'}$ and $R^{2'}$ represent an ethylene group, $R^{3'}$ represents a 2-oxocyclohexyl group, $Y^-$ represents $CF_3SO_3^-$, X' represents general formula (II'), both $R^{4'}$ and $R^{5'}$ represent a methyl group, Z' represents a hydrogen atom, m' is 1 and n' is 59, was synthesized according to the same procedures as in Example 20, except that 10 ml of 1,7-dichloro-octamethyltetrasiloxane was replaced with 3.5 ml of dimethyldichlorosilane.

$^1$H-NMR (acetone-$d_6$, internal standard: tetramethylsilane): δ (ppm) 0.25(s, 6H), 1.73–1.85(m, 4H), 1.90–2.24(m, 2H), 2.53–2.58(m, 2H), 2.67–2.77(m, 1H), 3.04–3.11(m, 8H), 5.05–5.10(m, 1H)

IR (KBr tablet, cm$^{-1}$) 3040($v_{C-H}$), 1710($v_{C=O}$), 1264($v_{C-F}$), 1160($v_{SO_3}$), 1100($v_{Si-O-Si}$), 1030($v_{SO_3}$)

Weight-Average Molecular Weight: 22,300

Elemental Analysis:

|  | C | H | S | F |
|---|---|---|---|---|
| Found (% by weight): | 35.54 | 5.80 | 14.25 | 12.91 |
| Calculated (% by weight): | 35.86 | 5.29 | 14.71 | 13.10 |

EXAMPLE 24

In this Example, a polymer having silicon atoms and sulfonium salt units of general formula (I'), in which $R^{1'}$ and $R^{2'}$ represent an ethylene group, $R^{3'}$ represents a 2-oxocyclohexyl group, $Y^-$ represents $CF_3SO_3^-$, X' represents general formula (II'), both $R^{4'}$ and $R^{5'}$ represent a t-butyl group, Z' represents a hydrogen atom, m' is 1 and n' is 53, was synthesized according to the same procedures as in Example 20, except that 10 ml of 1,7-dichloro-octamethyltetrasiloxane was replaced with 6.1 ml of di-t-butyldichlorosilane.

$^1$H-NMR (acetone-$d_6$, internal standard: tetramethylsilane): δ (ppm) 0.24(s, 2H), 1.05–1.12(m, 12H), 1.53–1.58(m, 2H), 1.73–1.85(m, 2H), 1.90–2.24(m, 4H), 2.53–2.58(m, 2H), 2.67–2.77(m, 1H), 3.04–3.11(s, 8H), 5.05–5.10(m, 1H)

IR (KBr tablet, cm$^{-1}$) 3040($v_{C-H}$), 1710($v_{C=O}$) 1264($v_{C-F}$), 1160($v_{SO_3}$) 1100($v_{Si-O-Si}$), 1030($v_{SO_3}$)

Weight-Average Molecular Weight: 10,500

Elemental Analysis:

|  | C | H | S | F |
|---|---|---|---|---|
| Found (% by weight): | 44.27 | 6.27 | 5.52 | 10.55 |
| Calculated (% by weight): | 43.93 | 6.74 | 5.33 | 10.98 |

EXAMPLE 25

In this Example, a polymer having silicon atoms and sulfonium salt units of general formula (I'), in which both $R^{1'}$ and $R^{2'}$ represent an ethylene group, $R^{3'}$ represents a 2-oxocyclohexyl group, $Y^-$ represents $CF_3SO_3^-$, X' represents general formula (II'), both $R^{4'}$ and $R^{5'}$ represent a methyl group, Z' represents a trimethylsilyl group, m' is 4 and n' is 37, was synthesized substantially in the same manner as in Example 20, except that ends of an intermediate polymer (formula (IV')) were capped with trimethylsilyl groups as follows.

First, a polymer of formula (IV'), in which both $R^{1'}$ and $R^{2'}$ are an ethylene group, X' is general formula (III'), both $R^{4'}$ and $R^{5'}$ are a methyl group, Z' is a hydrogen atom and m' is 4, was prepared by adding a 1,7-dichloro-octamethyltetrasiloxane into a solution of 2,2'-thiodiethanol in pyridine and thereafter heating the mixture as described in Example 20. Then, 2 g of the compound was dissolved in 20 ml of THF, and 0.5 g of hexamethyldisilazane was added to the solution and heated at 70° C. for 1 hr. At the end of the reaction, the reaction mixture was poured into dry methanol to perform reprecipitation. Thus, there was obtained a polymer having end groups end-capped with trimethylsilyl groups. Then, 2 g of this polymer was charged into a 300 ml four-necked flask, and 50 ml of a solution of 2-bromo-cyclohexanone 0.685 g (0.005 mol) in nitromethane were added dropwise therein. After agitating for 2 hrs., 100 ml of a solution of silver trifluoromethane-sulfonate 1.104 g (0.005 mol) in nitromethane was added thereto dropwise and agitated for additional three hours. At the end of the reaction, precipitate of silver bromide thus formed was filtered off with a glass filter (G4) and the solvent was distilled off from the filtrate under reduced pressure to concentrate it to about 50 ml. The resulting concentrate was poured into a large bulk of dry ether to perform reprecipitation. Thus, there was obtained 2.38 g of a polymer having silicon atoms and sulfonium salt units (yield: 72%). Structure of the final product was identified in the same manner as in Example 1.

$^1$H-NMR (acetone-$d_6$, internal standard: tetramethylsilane): δ (ppm) 0.12(s, 12H), 0.24(s, 12H), 1.73–1.85(m, 4H), 1.90–2.24(m, 2H), 2.53–2.58(m, 2H), 2.67–2.77(m, 1H), 3.04–3.11(m, 8H), 5.05–5.10(m, 1H)

IR (KBr tablet, cm$^{-1}$) 3040($v_{C-H}$) 1710(vC=O), 1264 ($v_{C-F}$), 1160($v_{SO_3}$) 1100($v_{Si-O-Si}$), 1030($v_{SO_3}$)

Weight-Average Molecular Weight: 31,500

Elemental Analysis:

|  | C | H | S | F |
|---|---|---|---|---|
| Found (% by weight): | 34.19 | 6.41 | 9.25 | 8.23 |
| Calculated (% by weight): | 34.44 | 6.19 | 9.67 | 8.61 |

EXAMPLE 26

In this Example, a polymer having silicon atoms and sulfonium salt units of general formula (I'), in which $R^{1'}$ and $R^{2'}$ represent an ethylene group, $R^{3'}$ represents a 2-oxopropyl group, $Y^-$ represents $CF_3SO_3^-$, X' represents general formula (II'), both $R^{4'}$ and $R^{5'}$ represent a methyl group, Z' represents a hydrogen atom, m' is 4 and n' is 53, was synthesized according to the same procedures as in Example 20, except that 0.685 g of 2-bromocyclohexanone was replaced with 0.68 g of bromoacetone.

$^1$H-NMR (acetone-d$_6$, internal standard: tetramethylsilane): δ (ppm) 0.12(s, 12H), 0.24(s, 12H), 2.67–2.77(s, 3H), 3.05–3.11(m, 4H), 5.05–5.10(s, 1H)

IR (KBr tablet, cm$^{-1}$) 3040($v_{C-H}$), 1710($v_{C=O}$) 1264($v_{C-F}$), 1160(vSO$_3$) 1100($v_{Si-O-Si}$), 1030($v_{SO_3}$)

Weight-Average Molecular Weight: 30,700

Elemental Analysis:

|  | C | H | S | F |
|---|---|---|---|---|
| Found (% by weight): | 31.56 | 5.43 | 9.26 | 8.32 |
| Calculated (% by weight): | 31.38 | 5.69 | 9.85 | 8.77 |

EXAMPLE 27

In this Example, a polymer having silicon atoms and sulfonium salt units of general formula (I'), in which $R^{1'}$ and $R^{2'}$ represent an ethylene group, $R^{3'}$ represents a 2-oxocyclohexyl group, $Y^-$ represents $CF_3SO_3^-$, X' represents general formula (II'), both $R^{4'}$ and $R^{5'}$ represent a phenyl group, Z' represents a hydrogen atom, m' is 1 and n' is 49, was synthesized according to the same procedures as in Example 20, except that 10 ml of 1,7-dichloro octamethyltetrasiloxane was replaced with 6 ml of dichlorodiphenylsilane.

$^1$H-NMR (acetone-d$_6$, internal standard: tetramethylsilane): δ (ppm) 1.73–1.85(m, 4H), 1.90–2.24(m, 2H), 2.53–2.58(m, 2H), 2.67–2.7(m, 1H), 3.04–3.11(m, 8H), 5.05–5.10(m, 1H), 7.12–7.73(m, 10H)

IR (KBr tablet, cm$^{-1}$) 3040($v_{C-H}$), 1710($v_{C=O}$), 1570 ($v_{C=C}$), 1264($v_{C-F}$), 1160($v_{SO_3}$), 1100($v_{Si-O-Si}$), 1030($v_{SO_3}$), 900($v_{C=C}$), 675($v_{C=C}$)

Weight-Average Molecular Weight: 24,500

Elemental Analysis:

|  | C | H | S | F |
|---|---|---|---|---|
| Found (% by weight): | 50.36 | 9.85 | 11.68 | 10.40 |
| Calculated (% by weight): | 50.86 | 9.36 | 11.95 | 10.84 |

EXAMPLE 28

First, 2 ml of a solution of the final product (concentration: 32 μmol) of Example 20 in acetonitrile was irradiated with ArF excimer laser beam (HE-460-SM-A type excimer laser manufactured by Lumonics Co.)(exposure area: 1 cm$^2$). Then, 2 ml of an acetonitrile solution containing sodium salt of tetrabromophenol Blue as a indicator was added to the exposed solution, and the mixture was diluted with acetonitrile to 20 ml. Visible light absorption spectra were measured on the diluted solution. The resulting acid was determined on the basis of change in absorbance at 619 nm according to the method described in the Analytical Chemistry, Vol.48, No.2, 450–451, 1976, as mentioned in Example 13. With regard to the relation between molar number and absorbance of acid, calibration was previously made from absorbances of the known amounts of p-toluenesulfonic acid and the acetonitrile solution as an indicator, and the calibration curve was used in the determination of acid.

It is identified by the above-mentioned determination that 20 nmol of acid was generated by irradiating the product of Example 20 with 80 mJ·cm$^{-2}$ of exposure amount.

As discussed above, the first polymer having silicon atoms and sulfonium salt units according to the present invention generates acids by being irradiated with the radiation such as deep U.V. light, excimer laser beam or the like, and with generation of acids the solubility of the polymers in a solvent extremely changes. Thus, the polymer is useful as a sensitizer for photoresist (i.e. as a photoacid generator) and a dissolution inhibitor. Furthermore, the first polymer of the present invention has the excellent resistance to oxygen plasma etching because of silicon atoms included in the molecule, and thus it is usefully used in the field of photoresist.

Furthermore, the second polymer having silicon atoms and sulfonium salt units according to the present invention also generates acids by being irradiated with the above radiation and particularly the light of short wavelengths of 200 nm or less. Thus, the polymer is useful as a cationic photopolymerization initiator using the light of shorter wavelengths such as light from the ArF excimer laser or the like and a sensitizer (a photoacid generator) for photoresist which is processed by the light of short wavelengths. In addition, these second polymer has also the excellent resistance to oxygen plasma etching because of silicon atoms included in the molecule, and thus it is usefully used in the field of photoresist.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A photoresist composition containing a polymer having silicon atoms and sulfonium salt units having a structure selected from the group consisting of the following formula (I):

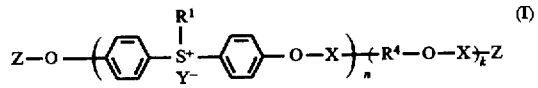

wherein n is a positive integer equal to 10 to 100 inclusive, k is 0 or a positive integer equal to 1 to 100 inclusive, a sum of n+k is a positive integer equal to 10 to 200 inclusive, a ratio of k/(n+k) is in a range of 0 to 0.9 inclusive. $Y^-$ is a counter ion selected from the group consisting of BF4$^-$, $AsF_6^-$, $SbF_6^-$, $PF_6^-$, $CF_3SO_3^-$, $Cl^-$, $Br^-$, $I^-$, $ClO_4^-$ and $CH_3SO_3^-$, $R^1$ is a radical selected from the group consisting of a phenyl group, $C_1$–$C_6$ alkyl-substituted phenyl group and $C_1$–$C_6$ alkyl group, $R^4$ is a divalent radical selected from the group consisting of a $C_2$–$C_8$ alkylene group and a phenylene group, Z is selected from the group consisting of a hydrogen atom and a trimethylsilyl group, and X is a divalent radical selected from the group consisting of the following formulae (II) and (III):

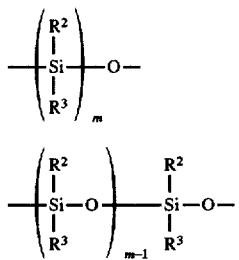

wherein m is a positive integer equal to 1 to 10 inclusive and $R^2$ and $R^3$ can be the same or different, each being a radical selected from the group consisting of a phenyl group, $C_1$–$C_6$ alkyl-substituted phenyl group and $C_1$–$C_6$ alkyl group; and the following formula (I'):

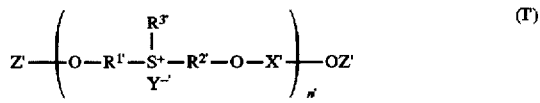

wherein n' is a positive integer equal to 20 to 169 inclusive, $Y^-$ is a counter ion selected from the group consisting of $BF_4^-$; $AsF_6^-$, $SbF_6^-$, $PF_6^-$, $CF_3SO_3^-$ $Cl^-$, $Br^-$, $I^-$, $ClO4^-$ and $CH_3SO_3^-$, $R^{1'}$ and $R^{2'}$ can be the same or different, each being a $C_2$–$C_{10}$ alkylene group, $R^{3'}$ is a $C_3$–$C_7$ 2-oxoalkyl group, Z' is selected from the group consisting of a hydrogen atom and a trimethylsilyl group, and X' is a divalent radical selected from the group consisting of the following general formulae (II') and (III'):

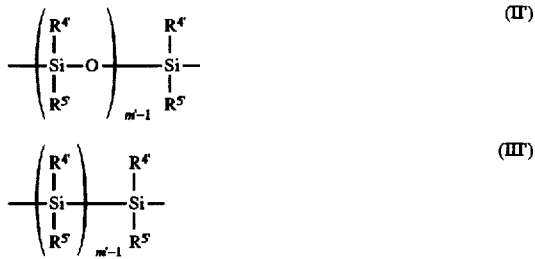

wherein m' is a positive integer equal to 1 to 10 inclusive and $R^{4'}$ and $R^{5'}$ can be the same or different, each being a radical selected from the group consisting of a $C_1$–$C_8$ alkyl group and a phenyl group.

2. A photoresist composition containing a polymer having silicon atoms and sulfonium salt units having the following formula (I):

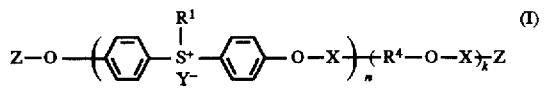

wherein n is a positive integer equal to 10 to 100 inclusive, k is 0 or a positive integer equal to 1 to 100 inclusive, a sum of n+k is a positive integer equal to 10 to 200 inclusive, a ratio of k/(n+k) is in a range of 0 to 0.9 inclusive, $Y^-$ is a counter ion selected from the group consisting of $BF_4^-$,
$AsF_6^-$, $SbF_6^-$, $PF_6^-$, $CF_3SO_3^-$ $Cl^-$, $Br^-$, $I^-$, $ClO_4^-$ and $CH_3SO_3^-$, $R^1$ is a radical selected from the group consisting of a phenyl group, $C_1$–$C_6$ alkyl-substituted phenyl group and $C_1$–$C_6$ alkyl group, $R^4$ is a divalent radical selected from the group consisting of a $C_2$–$C_8$ alkylene group and a phenylene group, Z is selected from the group consisting of a hydrogen atom and a trimethylsilyl group, and X is a divalent radical selected from the group consisting of the following formulae (II) and (III):

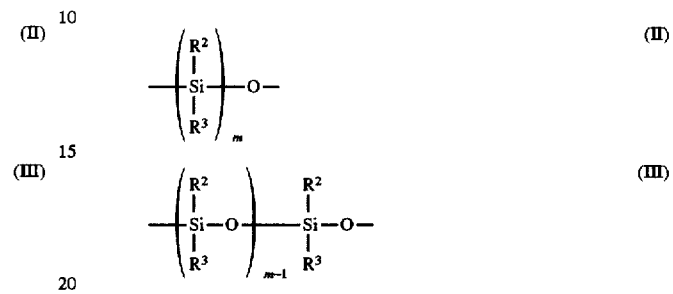

wherein m is a positive integer equal to 1 to 10 inclusive and $R^2$ and $R^3$ can be the same or different, each being a radical selected from the group consisting of a phenyl group, $C_1$–$C_6$ alkyl-substituted phenyl group and $C_1$–$C_6$ alkyl group.

3. The photoresist composition containing a polymer having silicon atoms and sulfonium salt units as defined in claim 2, wherein said $Y^-$ is a counter ion selected from the group consisting of $BF_4^-$, $AsF_6^-$, $SbF_6^-$, $PF_6^-$, and $CF_3SO_3^-$.

4. The photoresist composition containing a polymer having silicon atoms and sulfonium salt units as defined in claim 2, wherein said $R^1$ is a phenyl group.

5. The photoresist composition containing a polymer having silicon atoms and sulfonium salt units as defined in claim 2, wherein each of said $R^2$ and $R^3$ is a radical selected from phenyl, methyl and ethyl groups.

6. The photoresist composition containing a polymer having silicon atoms and sulfonium salt units as defined in claim 2, wherein said $R^4$ is a radical selected from the group consisting of linear and branched $C_2$–$C_8$ alkylene groups and a $C_5$–$C_8$ cycloalkylene group.

7. The polymer having silicon atoms and sulfonium salt units as defined in claim 2, wherein said $R^4$ is a radical selected from ethylene, octylene, 1,4-cyclohexylene, 1,4-cyclohexane-dimethylene and phenylene groups.

8. The photoresist composition containing a polymer having silicon atoms and sulfonium salt units as defined in claim 2, wherein said n is an integer selected from 64, 92, 34, 28, 47, 37 and 14.

9. The photoresist composition containing a polymer having silicon atoms and sulfonium salt units as defined in claim 2, wherein said k is an integer selected from 0, 34, 28, 12, 9 and 57.

10. The photoresist composition containing a polymer having silicon atoms and sulfonium salt units as defined in claim 2, wherein said n is 64, said k is 0, said $Y^-$ is $CF_3SO_3^-$, said $R^1$ is a phenyl group, said Z is a hydrogen atom, said X is the following general formula (III):

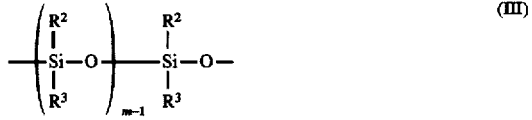

in which m is 3 and both $R^2$ and $R^3$ are a methyl group.

11. The photoresist composition containing a polymer having silicon atoms and sulfonium salt units as defined in claim 1, wherein said Y⁻ is a counter ion selected from the group consisting of BF4⁻, AsF6⁻, SbF6⁻, PF6⁻ and CF3SO3⁻.

12. A photoresist composition containing a polymer having silicon atoms and sulfonium salt units represented by the following general formula (I'):

wherein n' is a positive integer equal to 20 to 169 inclusive, Y⁻ is a counter anion selected from the group consisting of $BF_4^-$, $AsF_6^-$, $SbF_6^-$, $PF_6^-$, $CF_3SO_3^-$, $Cl^-$, $Br^-$, $I^-$, $ClO_4^-$ and $CH_3SO_3^-$, $R^{1'}$ and $R^{2'}$ can be the same or different, each being a $C_2$–$C_{10}$ alkylene group, $R^{3'}$ is a $C_3$–$C_7$ 2-oxoalkyl group, Z' is selected from the group consisting of a hydrogen atom and a trimethylsilyl group, and X' is a divalent radical selected from the group consisting of the following general formulae (II') and (III'):

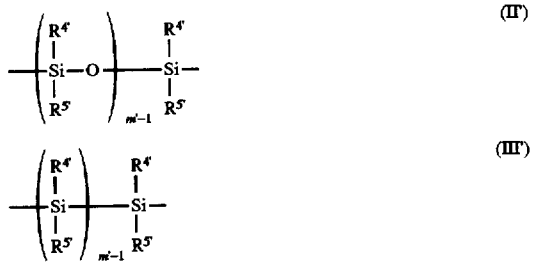

wherein m' is a positive integer equal to 1 to 10 inclusive and $R^{4'}$ and $R^{5'}$ can be the same or different, each being a radical selected from the group consisting of a $C_1$–$C_8$ alkyl group and a phenyl group.

13. The photoresist composition containing a polymer having silicon atoms and sulfonium salt units as defined in claim 12, wherein said n' is a positive integer equal to 20 to 150 inclusive.

14. The photoresist composition containing a polymer having silicon atoms and sulfonium salt units as defined in claim 12, wherein said $R^{1'}$ is a radical selected from ethylene and propylene groups.

15. The photoresist composition containing a polymer having silicon atoms and sulfonium salt units as defined in claim 12, wherein said $R^{2'}$ is a radical selected from ethylene and propylene groups.

16. The photoresist composition containing a polymer having silicon atoms and sulfonium salt units as defined in claim 12, wherein said $R^{3'}$ is a radical selected from 2-oxocyclohexyl and 2-oxopropyl groups.

17. The photoresist composition containing a polymer having silicon atoms and sulfonium salt units as defined in claim 12, wherein each of said $R^{4'}$ and $R^{5'}$ is a radical selected from phenyl, methyl and t-butyl groups.

18. The photoresist composition containing a polymer having silicon atoms and sulfonium salt units as defined in claim 12, wherein said m' is an integer selected from 1 and 4.

19. The photoresist composition containing a polymer having silicon atoms and sulfonium salt units as defined in claim 12, wherein said n' is an integer selected from 53, 169, 46, 59, 37 and 49.

20. The photoresist composition containing a polymer having silicon atoms and sulfonium salt units as defined in claim 12, wherein said n' is 53, said Y' is $CF_3SO_3^-$, $R^{1'}$ is an ethylene group, said $R^{2'}$ an ethylene group, $R^{3'}$ is 2-oxocyclohexyl group, Z' is a hydrogen atom, X' is the following general formula (III'):

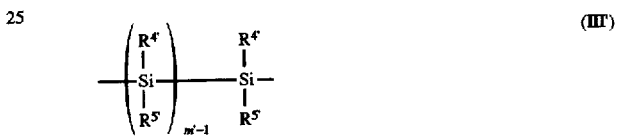

wherein m' is 4 and both $R^{4'}$ and $R^{5'}$ are a methyl group.

21. The photoresist composition containing a polymer having silicon atoms and sulfonium salt units as defined in claim 12, wherein said $C_2$–$C_{10}$ alkylene group of $R^{1'}$ and $R^{2'}$ is linear, branched or cyclic.

22. The photoresist composition containing a polymer having silicon atoms and sulfonium salt units as defined in claim 12, wherein said $C_3$–$C_7$ 2-oxoalkyl group of $R^{3'}$ is linear, branched or cyclic.

23. The photoresist composition containing a polymer having silicon atoms and sulfonium salt units as defined in claim 12, wherein said $C_1$–$C_8$ alkyl group of $R^{4'}$ and $R^{5'}$ is linear, branched or cyclic.

* * * * *